(12) United States Patent
Patwardhan et al.

(10) Patent No.: US 6,925,591 B2
(45) Date of Patent: Aug. 2, 2005

(54) METHOD AND APPARATUS FOR PROVIDING FULL ACCESSIBILITY TO INSTRUCTION CACHE AND MICROCODE ROM

(75) Inventors: Chandrashekhar S. Patwardhan, Haifa (IL); James Earl White, Gilbert, AZ (US); Richard Brunner, Gilbert, AZ (US); Yan Xu, Phoenix, AZ (US); Kenneth Griesser, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/850,901

(22) Filed: May 21, 2004

(65) Prior Publication Data

US 2004/0225841 A1 Nov. 11, 2004

Related U.S. Application Data

(60) Continuation of application No. 08/988,616, filed on Dec. 11, 1997, now abandoned, which is a division of application No. 08/315,930, filed on Sep. 30, 1994, now abandoned.

(51) Int. Cl.[7] .............................. G06F 9/32; G06F 9/22
(52) U.S. Cl. ...................... 714/733; 714/734; 714/30; 714/718; 714/36; 712/236; 712/226; 712/234; 712/244; 711/102; 711/103; 711/213; 710/2; 710/1
(58) Field of Search ................................ 711/102, 103, 711/132, 204, 213; 712/226, 230, 231, 234, 236, 244; 713/1, 2, 601; 714/25, 30, 34, 36, 718, 733, 734; 710/262

(56) References Cited

U.S. PATENT DOCUMENTS

| 3,921,142 A | 11/1975 | Bryant et al |
| 4,037,204 A | * 7/1977 | Bennett et al. ............. 710/262 |
| 4,293,950 A | 10/1981 | Shimizu et al. |

(Continued)

Primary Examiner—B. James Peikari
(74) Attorney, Agent, or Firm—Blakely, Sokoloff, Taylor & Zafman LLP (57) ABSTRACT

A method and apparatus for providing full accessibility to on-chip instruction cache and microcode ROM are described. A dummy tag and a dummy instruction are written into a cache tag array and an instruction array, respectively, during a test mode. The dummy tag is concatenated with a predetermined set number and a predetermined word address to form a dummy address having a dummy tag field, a set field and a word address field. An instruction fetch is invoked using the dummy address. The instruction cache is accessed with the dummy address, and a cache miss is forced to occur. The dummy tag field of the dummy address is written into the tag array at a row specified by the predetermined set number, and the dummy instruction is written into the instruction array at the same row. Execution of the dummy instruction is suppressed. A read operation is performed in a similar manner, except in that case an instruction cache hit is forced to occur to cause data to be read from the instruction cache. Execution of the data read from the cache is suppressed. Microcode ROM is also read by invoking a dummy instruction fetch. The dummy instruction fetch causes data to be retrieved from a predetermined address in the ROM. Execution of the retrieved data is suppressed.

15 Claims, 7 Drawing Sheets

U.S. PATENT DOCUMENTS

| | | |
|---|---|---|
| 4,687,989 A | 8/1987 | Davis et al. |
| 4,841,485 A | 6/1989 | Prilik et al. |
| 4,855,902 A | 8/1989 | Kozlik et al. |
| 4,870,573 A | 9/1989 | Kawata et al. |
| 5,165,029 A | 11/1992 | Sawai et al. |
| 5,175,840 A | 12/1992 | Sawase et al. |
| 5,185,882 A | 2/1993 | White, Jr. et al. |
| 5,226,009 A | 7/1993 | Arimoto |
| 5,249,281 A | 9/1993 | Fuccio et al. |
| 5,343,434 A | 8/1994 | Noguchi |
| 5,345,582 A | 9/1994 | Tsuchiya |
| 5,367,653 A | 11/1994 | Coyle et al. |
| 5,410,669 A | 4/1995 | Biggs et al. |
| 5,454,114 A * | 9/1995 | Yach et al. ............... 713/330 |
| 5,457,696 A | 10/1995 | Mori |
| 5,493,667 A | 2/1996 | Huck et al. |
| 5,590,273 A | 12/1996 | Balbinot |
| 5,959,912 A | 9/1999 | Powell et al. |

* cited by examiner

ADDR1: SET DATA

WAY A { TAG, VALID BITS, INST 0, INST 1, INST 2, INST 3

WAY B { TAG, VALID BITS, INST 0, INST 1, INST 2, INST 3

FIG. 5

| RESERVED | SET DATA (INCLUDING LRU) | WAY | R/W | DATA PATH | TAG VALID BIT |

FIG. 6

| RESERVED | SET NUMBER | WORD ADDRESS |

FIG. 7

CACHE/ROM DEBUG HIT LOGIC

| CASE DESCRIPTION | INPUTS | | | | | OUTPUTS | | |
|---|---|---|---|---|---|---|---|---|
| | CDEBUG | MACMOD | R/W (0/1) | WAY (A=0, B=1) | HIT A | HIT B | FETVLD |
| NORMAL ROM ACCESS | 0 | 0 | X | X | 0 | 0 | 1 |
| CDEBUG ROM READ ACCESS | 1 | 0 | X | X | 0 | 0 | 1 |
| NORMAL CACHE ACCESS | 0 | 1 | X | X | TC | TC | TC |
| CDEBUG WRITE WAY A | 1 | 1 | 1 | 0 | 0 | 0 | 0* |
| CDEBUG WRITE WAY B | 1 | 1 | 1 | 1 | 0 | 0 | 0* |
| CDEBUG READ WAY A | 1 | 1 | 0 | 0 | 1 | 0 | 1 |
| CDEBUG READ WAY B | 1 | 1 | 0 | 1 | 0 | 1 | 1 |

X = DON'T CARE
TC = BASED UPON TAG COMPARISON

\* = INITIALLY 0, THEN CHANGES TO 1 AS DATA RETURNS FROM TEST REGISTER

FIG. 8

TAG WRITE MUX

| CASE DESCRIPTION | INPUTS | | | | | OUTPUTS | | | |
|---|---|---|---|---|---|---|---|---|---|
| | CDEBUG | MACMOD | R/W (0/1) | WAY (A=0,B=1) | | WRVALA | WRA | WRVALB | WRB |
| ROM ACCESS | X | 0 | X | X | | X | 0 | X | 0 |
| NORMAL CACHE ACCESS | 0 | 1 | X | X | | TC | TC | TC | TC |
| CDEBUG WRITE WAY A | 1 | 1 | 1 | 0 | | CCR | 1 | X | 0 |
| CDEBUG WRITE WAY B | 1 | 1 | 1 | 1 | | X | 0 | CCR | 1 |
| CDEBUG READ WAY A | 1 | 1 | 0 | X | | X | 0 | X | 0 |
| CDEBUG READ WAY B | X | 0 | X | X | | X | 0 | X | 0 |

X = DON'T CARE
TC = BASED UPON TAG COMPARISON
CCR = TAKE TAG VALID BIT FROM CCR
WRVAL(A/B) = VALUE WRITTEN INTO WAY (A/B)
WR(A/B) = WRITE CONTROL SIGNAL FOR WAY (A/B)

FIG. 9

METHOD AND APPARATUS FOR PROVIDING FULL ACCESSIBILITY TO INSTRUCTION CACHE AND MICROCODE ROM

This application is a Continuation of application Ser. No. 08/988,616 filed Dec. 11, 1997, now abandoned, which is a Divisional of application Ser. No. 08/315,930 filed Sept. 30, 1994 now abandoned.

BACKGROUND OF THE INVENTION

1. Field of the Invention

The present invention relates to microprocessor testability, and in particular to providing full access to on-chip instruction cache and microcode ROM.

2. Description of the Related Art

The on-chip instruction cache of a microprocessor or microcontroller plays an important role in guaranteeing a high instruction throughput. It is therefore critical that the instruction cache operate properly. To do so requires that the instruction cache be tested for memory faults, such as stuck-at faults and cross coupling faults, among others. Testing is performed by writing a test pattern into the cache memory, and then reading out the data just written to verify the write operation. Alternatively, a test instruction can be written into the instruction cache and the execution stream observed to determine whether the instruction was correctly stored in the cache. The testability of caches has become increasingly important because as cache memory capacity and density have increased, the probability of less common defects occurring has increased.

The i960® CA/CF microprocessor, manufactured by the assignee of the present invention, achieves instruction cache verification through user-input instructions by storing dummy instructions in external memory, invalidating the entire instruction cache, and then posting a dummy instruction fetch so that the instruction cache is forced to retrieve and cache a dummy instruction from external memory. In a similar manner, a built-in self-test (BIST) routine that is incorporated into i960® CA/CF microcode can write dummy instructions into the instruction cache from internal on-chip registers, rather than external memory, by posting dummy instruction fetches. In either case, however, test patterns can only be written into the instruction data area of the instruction cache, and not into the tag array, the LRU (least recently used) bits, the tag valid bits or the word valid bits.

Access to those other areas of the cache could be achieved by providing extra registers into which are written the tags, the dummy instructions, and the associated valid and LRU bits. An extra on-chip state machine would then address the cache at a selected line and load the data from the extra registers into the cache tag and instruction arrays, and into the valid bits and the LRU bits. This scheme, however, would require extra on-chip hardware that would occupy an unacceptable amount of chip area and incur an excessive validation cost.

For reasons similar to those given above, in the past it has been difficult to provide full access to microcode ROM memory cells without requiring extra on-chip hardware to provide full access, e.g., extra registers to hold the contents read from ROM and hardware to access those registers.

It is thus desired to provide an efficient means to access all parts of an on-chip instruction cache and microcode ROM while occupying only a small amount of additional chip area.

SUMMARY OF THE INVENTION

The present invention provides a method and apparatus for providing full accessibility to on-chip instruction cache and microcode ROM. The instruction cache includes a tag array and an instruction array, both divided into rows with each row being specified by a set number. Each row of the instruction array is divided into a number of instruction word fields. Test data, including a dummy tag and a dummy instruction, is written into the tag array and the instruction array, respectively, during a test mode. The dummy tag is concatenated with a predetermined set number and a predetermined word address to form a dummy address having a dummy tag field, a set field and a word address field. An instruction fetch is invoked using the dummy address as an instruction fetch address. The instruction cache is accessed with the dummy address, and a cache miss is forced to occur. The dummy tag field of the dummy address is written into the tag array at a row specified by the predetermined set number, and the dummy instruction is written into the instruction array at the same row. Execution of the dummy instruction is suppressed.

A read operation is performed in a similar manner, except in that case an instruction cache hit is forced to occur to cause data to be read from the instruction cache regardless of whether the dummy address hits the tag array. Execution of the data read from the cache is suppressed.

Microcode ROM is also read by invoking a dummy instruction fetch. The dummy instruction fetch causes data to be retrieved from a predetermined address in the ROM. Execution of the retrieved data is suppressed.

BRIEF DESCRIPTION OF THE DRAWINGS

The objects, features and advantages of the present invention will be apparent to one skilled in the art in light of the following detailed description in which.

DETAILED DESCRIPTION OF THE INVENTION

The present invention provides a method and apparatus for providing full accessibility to on-chip instruction cache and microcode ROM. For purposes of explanation, specific details are set forth to provide a thorough understanding of the present invention. However, it will be apparent to those skilled in the art that the invention may be practiced without these details. In other instances, well known elements, devices, process steps and the like are not set forth in detail in order to avoid unnecessarily obscuring the present invention.

Figure 1:
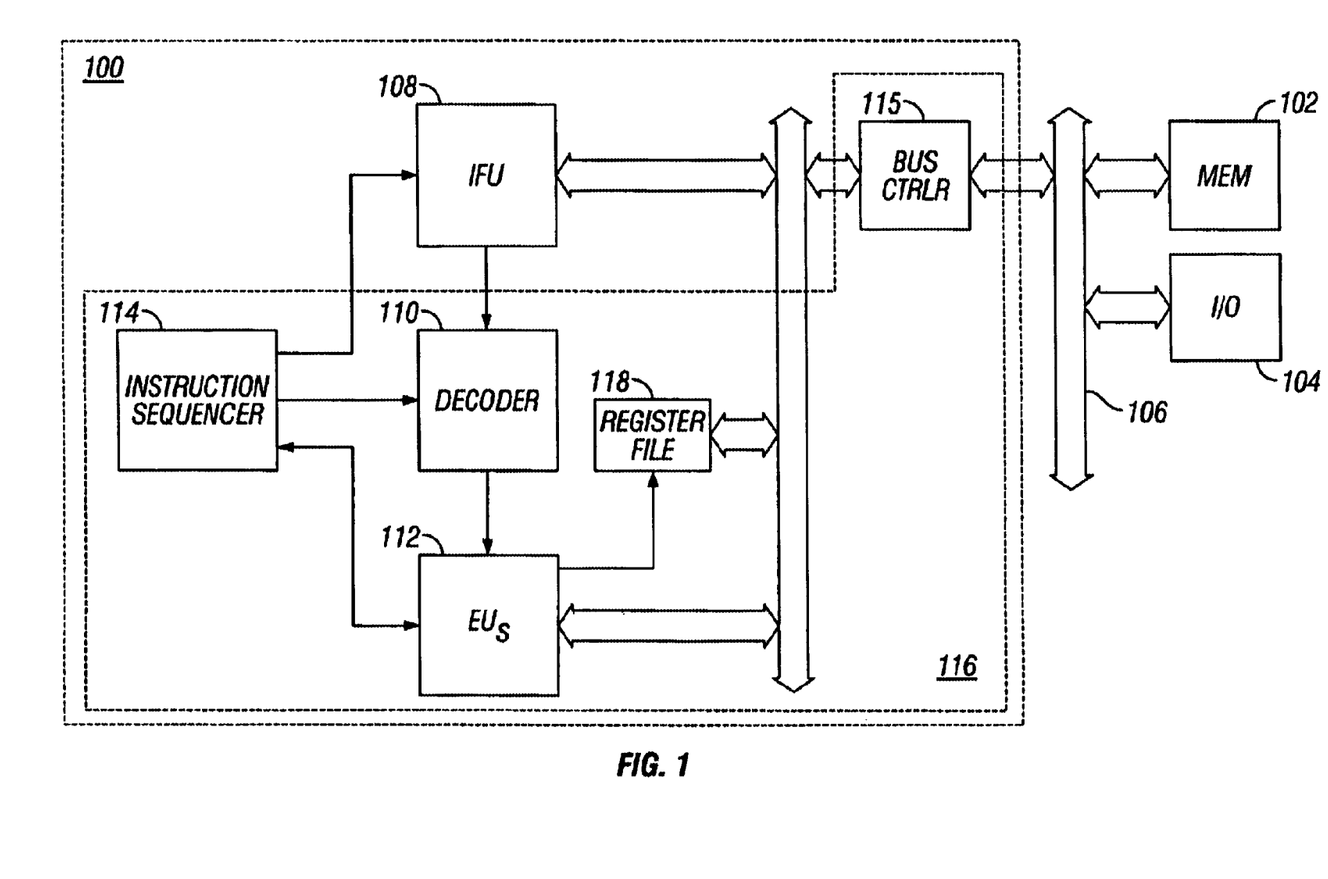
FIG. 1 illustrates a typical computer system in which the present invention may be incorporated.

FIG. 1 illustrates a typical computer system, such as one of the 80960 J-series processors, in which the present invention may be incorporated. After reading this disclosure, one skilled in the art will understand that the applicability of the present invention is not limited to a computer system of the form illustrated in FIG. 1, but may generally be extended to any computer system that incorporates an instruction cache on the processor chip. The computer system of the present invention includes a microprocessor or microcontroller chip 100 that is coupled to an external memory device 102 and an external I/O device 104 through a system bus 106. The processor chip itself includes an instruction fetch unit (IFU) 108, an instruction decoder 110, and several execution units (EUs) 112. The operation of these processor components is controlled by control signals from an instruction sequencer 114. The processor chip 100 also includes a bus controller 115 that couples the processor to the system bus 106. For the sake of convenience, the bus controller 115, the instruction sequencer 114, the decoder 110 and the execution units 112 will be denoted as comprising a processor core 116.

The instruction sequencer 114 initiates an instruction fetch by sending an instruction address to the IFU 108. The IFU 108 includes a microcode ROM and an instruction cache (shown in FIG. 2). The instruction address corresponds to the address of an instruction in microcode ROM or an external memory address of an instruction that resides either in the instruction cache or the external memory 102. If the instruction address does not hit the instruction cache and is not intended for microcode ROM, then the address is sent to the external memory 102 through the bus controller 115, and the requested instruction is retrieved from the external memory 102. The fetched instruction is transferred to the decoder 110 which provides control signals and operand data to the appropriate execution unit 112 to execute the instruction. After execution, the execution unit 112 typically stores the result in a register file 118.

Figure 2:
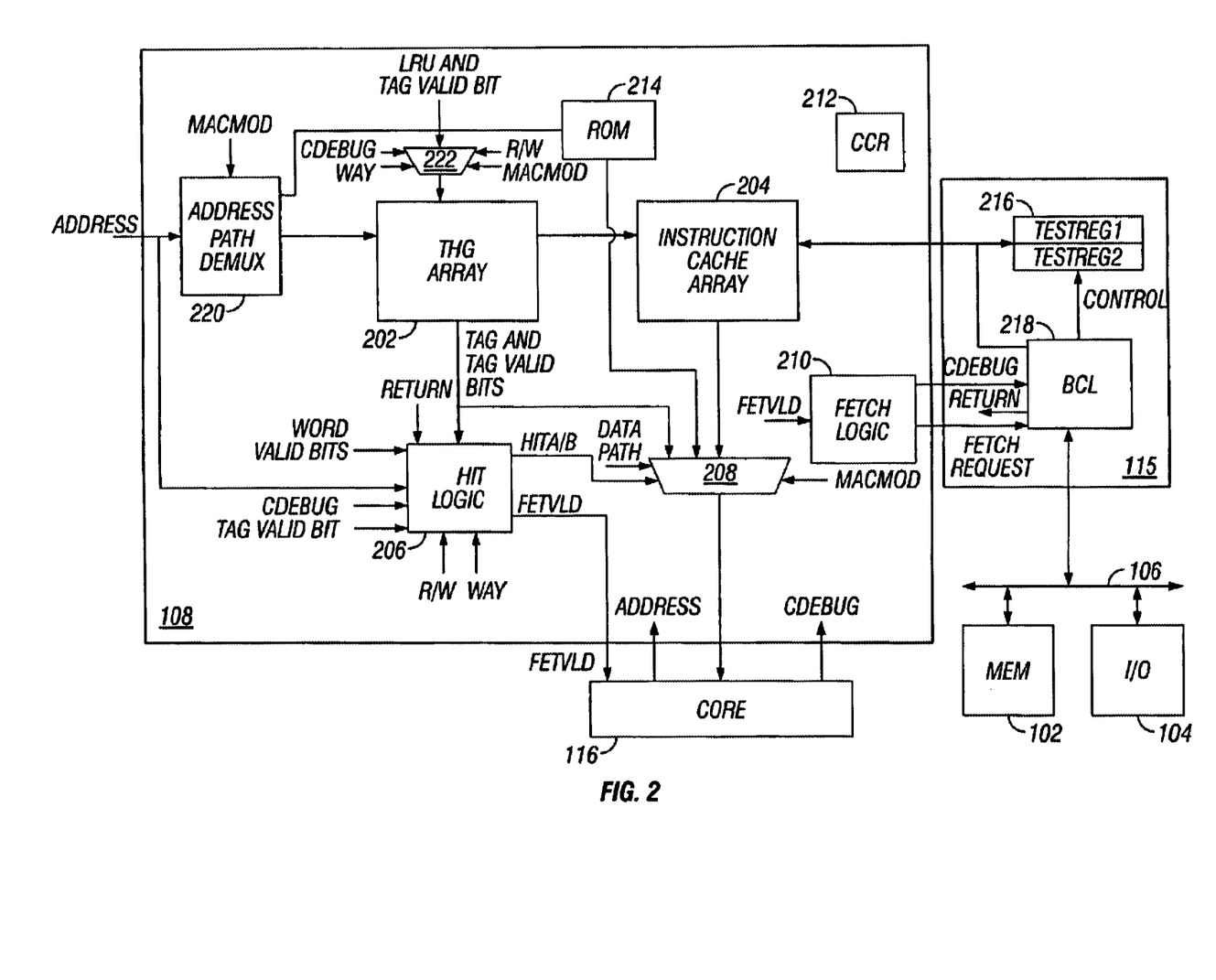
FIG. 2 is a detailed illustration of the instruction fetch unit and the bus controller of the present invention.

FIG. 2 illustrates the computer system of the present invention in more detail. The instruction fetch unit 108 includes an instruction cache tag array 202, an instruction cache data array 204 for storing instructions, a hit logic circuit 206, a instruction data path multiplexer (MUX) 208, a fetch logic circuit 210, and a cache control register (CCR) 212. One skilled in the art will recognize that the CCR 212 may alternatively reside in the processor core 116 or the bus controller 115. The instruction fetch unit 108 further includes a microcode ROM 214. An address path demultiplexer 220 passes the instruction address to either the instruction cache or the ROM depending upon the type of access to be made.

The bus controller 115 of the present invention includes a bus controller logic circuit 218 and two memory mapped test registers 216 TESTREG1 and TESTREG2. As described below, TESTREG1 preferably stores a dummy instruction, and TESTREG2 stores a dummy instruction word valid bit.

Figure 3:
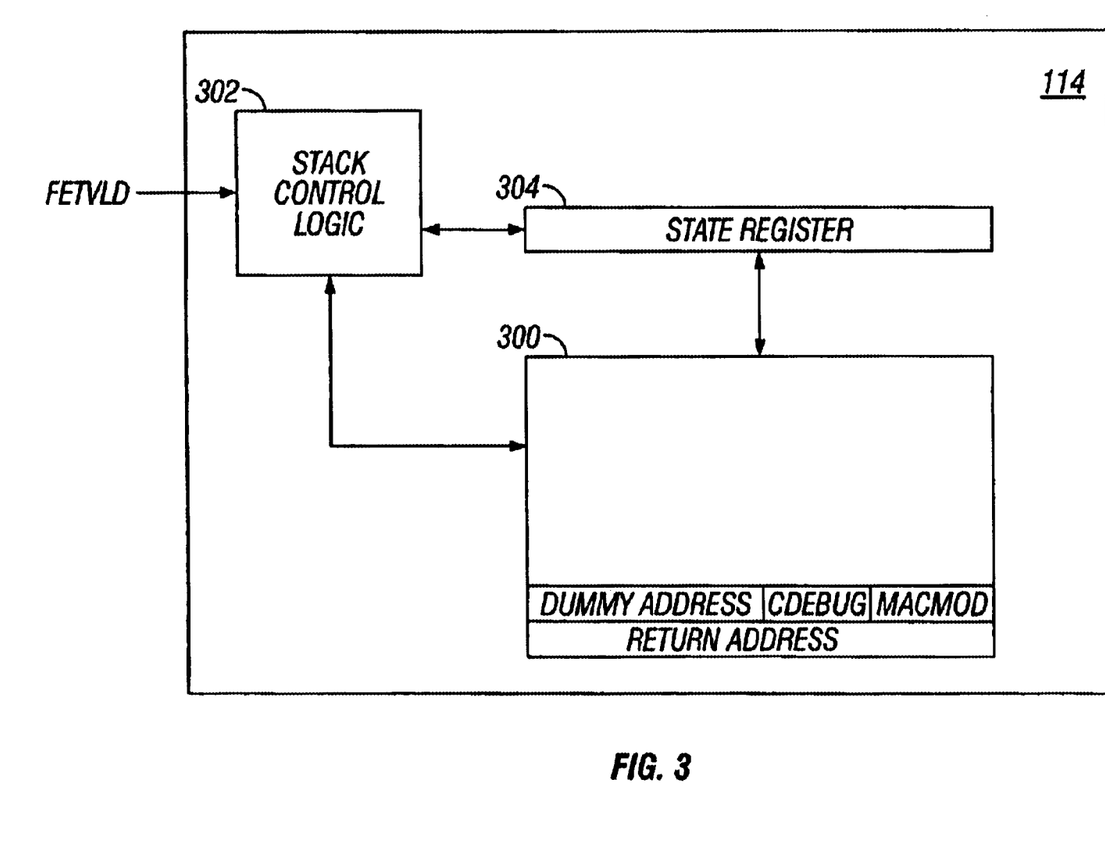
FIG. 3 illustrates an instruction sequencer of the present invention.

FIG. 3 illustrates the components of the instruction sequencer 114 that are most pertinent to the present invention. The instruction sequencer 114 includes a microaddress stack 300, which is controlled by a stack control logic circuit 302. Entries popped off the stack 300 may be latched in a state register 304.

Cache Write Operation

The operation of the present invention will be described with respect to FIGS. 2 and 3, and the flow chart of FIG. 4. The writing of data to the instruction cache will be described first. Unlike conventional microprocessors, the present invention allows not just the instructions to be written into the instruction cache array 204, but further permits the instruction cache tags, the tag valid bits, the word valid bits, and the LRU bits to be written, thus achieving full cache accessibility. The data written into the cache may be input through a number of methods. For example, data may be entered externally from outside the processor chip using a special instruction described below. Alternatively, data may be entered internally from within the processor chip using a built-in self-test (BIST) routine programmed into microcode ROM. BIST is well known in the art.

Figure 4:
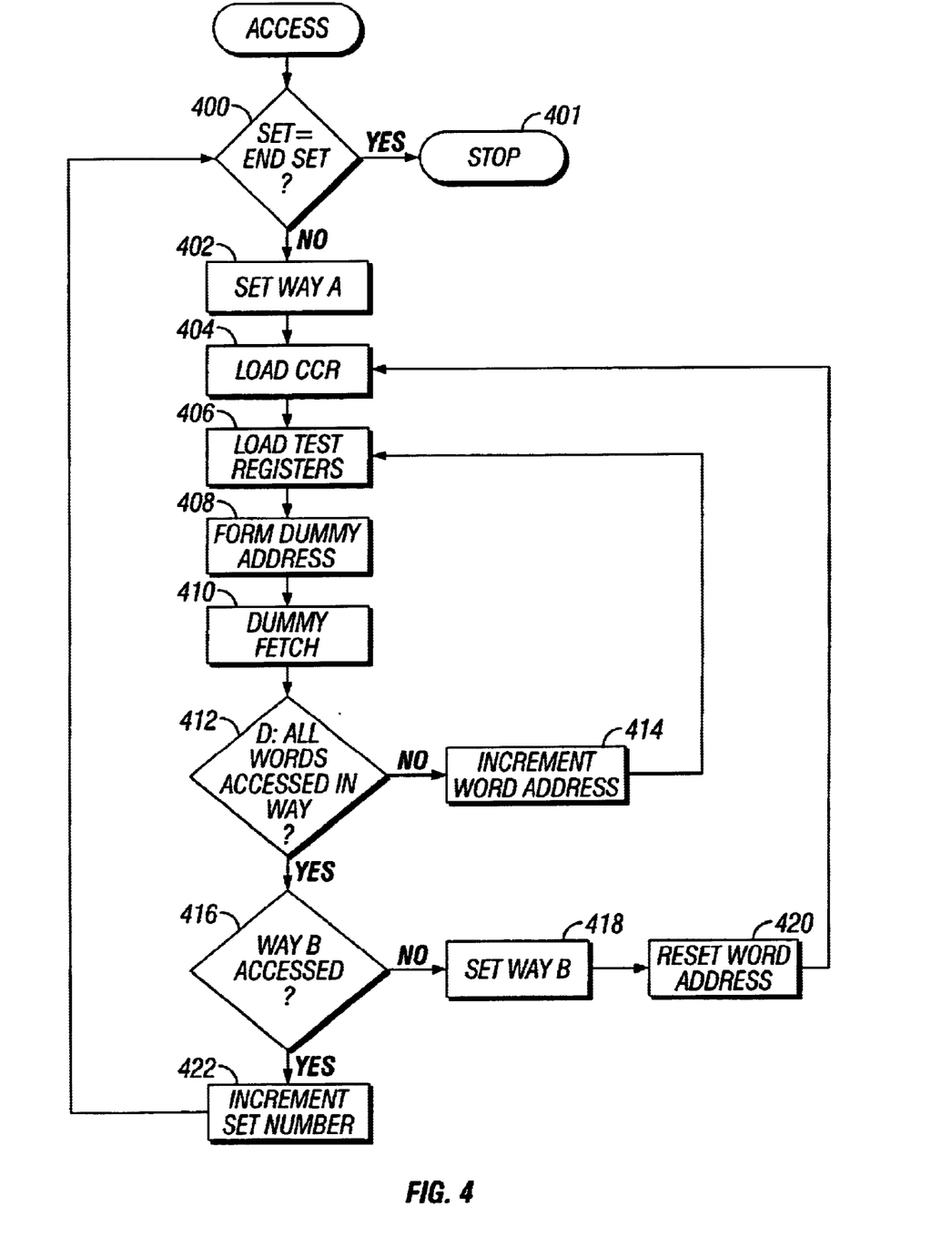
FIG. 4 is a flow chart diagramming the operation of the present invention.

FIG. 4 illustrates the process steps performed to write the cache according to the present invention. These steps, as well as those performed for any access described herein may be executed by microcode in the microcode ROM 214 or implemented using a state machine or other hardware. The term "programming logic" refers generally to the means employed to perform the process steps. The invention will be described below with reference to a microcode implementation, but those skilled in the art will understand that any form of programming logic may be employed for any of the accesses described herein.

The microcode is invoked either by an externally-provided instruction or a BIST routine modified to incorporate the microcode routine (programming logic) diagrammed in FIG. 4. Those skilled in the art will recognize that events such as interrupts and faults, special test modes, test registers and other means can alternatively invoke the microcode routine (programming logic). The embodiment of FIG. 4 writes the cache on a set-by-set basis starting from a starting set and terminating at an ending set. Another embodiment permitting the cache to be written on a word-by-word basis will also be described. To initiate the process, certain control parameters must be predetermined. These parameters may be fixed in the invoking microcode ROM or provided by the user using a special instruction that may be entered externally. This instruction cache control instruction is of the form ICCTL (R/W, ADDR 1, starting set number, ending set number), where R/W specifies whether the cache is to be read or written, and ADDR 1 specifies a starting address in external memory of a data structure that serves as the source of data to be written into the cache. The starting set number and ending set number are self-explanatory. Those skilled in the art will recognize that the arguments passed externally by the ICCTL instruction and the data provided from external memory could alternatively be fixed in microcode ROM or in internal CPU registers when the data serves as parameters for the BIST routine.

Figure 5:
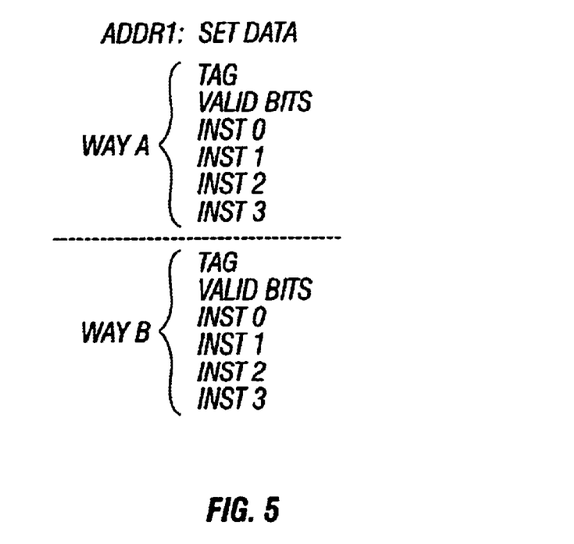
FIG. 5 illustrates a data structure preferably employed by the present invention.

FIG. 5 illustrates the external memory data structure preferably employed by the present invention. The data structure shown in FIG. 5 supplies data to be written into a two-way, set-associative cache. Those skilled in the art will recognize that the present invention may easily be extended to an N-way cache or a direct mapped cache. In the data structure, SET DATA stores data specific to the set being written, such as the LRU bit. TAG represents the "dummy" tag to be written into the tag array 202 for each way. The dummy tag may be an actual tag value or any user-defined bit pattern. VALID BITS specifies the tag valid bits and the word valid bits to be written into the cache array 204 In this example, it is assumed that the cache 204 stores four instruction words per way and thus must include four word valid bits per way. Of course, the present invention is not limited to this constraint. INST 0–INST 3 are the four "dummy" instruction words to be written in each way. The dummy instruction words may be actual valid instructions or any user-defined bit pattern. The data structure of FIG. 5 includes the data to be written for both Way A and Way B in the two-way, set-associative cache of this example.

Figure 6:
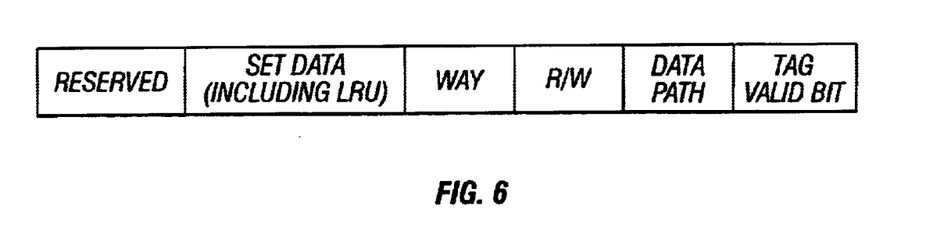
FIG. 6 illustrates the cache control register of the present invention.

FIG. 6 illustrates the cache control register (CCR) 212 of the present invention. The CCR 212 includes a number of fields that maintain parameters used by the microcode implementing the ICCTL instruction or the BIST routine. These parameters include the tag valid bit, a data path control bit, an R/W (read/write) bit, a way bit, and an LRU bit. The data path control bit is used to control the data path MUX 208 during a read operation to permit the reading of either (i) words from the cache array 204, or (ii) the word valid bits from the cache array 204 along with the tag and the tag valid bit from the tag array 202, as described below. The way bit selects the way of the cache that is being accessed. One bit is required for a two-way, set-associative cache. Those skilled in the art will recognize that more than one way bit would be used to access an N-way, set-associative cache. The tag valid and LRU bits are values to be written into corresponding bits in the cache array during a dummy write access, as described below. The R/W bit (preferably R=0, W=1) defines whether the dummy access is a read or write access. The tag valid bit, the R/W bit and the LRU bit are self-explanatory.

Those skilled in the art will recognize that the order of the parameters in the data structure of FIG. 5 and the CCR of FIG. 6 is unimportant. For example, the LRU and word VALID BITS may alternatively be extracted from a different data structure or generated internally. Further, it will be appreciated that when the present invention is executed by BIST or other microcode rather than by a user instruction, the parameters stored in the external data structure could be maintained in internal CPU registers.

Using these parameters, the present invention performs a cache write operation according to the microcode routine (programming logic) diagrammed in FIG. 4. If the starting set number is equal to the ending set number (step 400), then the desired area of the cache has been written and execution will be terminated (step 401). At this point, the user or the BIST routine or other microcode can, for example, perform a read operation, as described below. If, however, the write operation is not complete, then the microcode sets the write operation to begin at Way A (the first of the two ways) (step 402). To set Way A, the microcode preferably sets the way bit of the CCR 212 to 0.

After setting the way bit, the CCR 212 is loaded with the LRU bit from the SET DATA, the tag valid bit from the VALID BITS, and the R/W bit (step 404). Those skilled in the art will recognize that the present invention is not limited to caches that use an LRU bit for their cache replacement policy, but is easily extendable to caches that use any cache replacement policy. When running the ICCTL instruction, the LRU and tag valid bits are loaded from the external memory data structure, while the R/W bit is passed directly by the ICCTL instruction. Alternatively, when running BIST or other microcode, these values may be obtained from an internal CPU register or the microcode itself.

After loading the CCR 212, the microcode loads TESTREG1 216 with INST 0, and TESTREG2 216 with the first word valid bit from the VALID BITS (step 406). At this point, the dummy instruction and the valid bits have been made available to the bus controller 115 for writing into the first word of Way A of the starting set.

After loading the test registers, the microcode forms a dummy address corresponding to the dummy instruction stored in the test registers (step 408). The microcode preferably concatenates a dummy tag with the set number and the word address. When running ICCTL, the tag is retrieved from the TAG value in the external memory data structure, while when running BIST or other microcode, the tag may be maintained in an internal CPU register. Initially, the set number is the starting set number, which is incremented after each set is written until the ending set has been written. For each way, the word address is initially the first word in the way. This value is incremented until all words within a way have been written. Preferably four words are stored in each way in this example. The dummy address may be stored in any microcode-accessible register.

At this point, the task is to use the dummy address and the dummy instruction, along with the accompanying valid bits, to write the tag, the instruction, the LRU bit and the valid bits into the cache. According to conventional microprocessor technology, it is not possible to write the instruction cache array 204 and the tag array 202 without requiring the incorporation of an unacceptable amount of extra hardware. The present invention accomplishes full accessibility to both the cache data array 204 and the tag array 202 without requiring excessive hardware additions by taking advantage of the normal instruction fetch mechanism within many conventional processors. The present invention achieves this objective by invoking a dummy instruction fetch that writes the tag field from the dummy address into the tag array 202, and the dummy instruction from TESTREG1 into the cache array 204 (step 410). Existing microprocessor hardware is modified to force a cache miss during the instruction fetch and to suppress the bus controller 115 from attempting to retrieve the addressed instruction from external memory. The dummy instruction fetch is preferably implemented in a processor (such as the i960) as follows. Those skilled in the art will recognize that the present invention as described herein may easily be incorporated into any microprocessor having an on-chip instruction cache.

Referring to the instruction sequencer of FIG. 3, the microcode executes the following subroutine to initiate the dummy instruction fetch:

PUSH RETURN ADDRESS D
PUSH DUMMY ADDRESS, CDEBUG, MACMOD
MICROCODE RETURN
D: CONTINUE

The microcode pushes a return address, D, onto the microaddress stack 300 of the instruction sequencer 114. Those skilled in the art will understand that the dummy instruction fetch maybe initiated by any procedure return stack, and is not limited to the microaddress stack described as an example herein. The microcode subsequently pushes the dummy address along with two states bits onto the microaddress stack 300. The first state, CDEBUG, indicates whether a dummy instruction fetch, rather than an actual instruction fetch, is to be performed. The second state, MACMOD, indicates whether the access is to the cache, or to the microcode ROM. The CDEBUG bit is preferably set to 1 and the MACMOD bit to 1 to perform a cache access either in response to the ICCTL instruction, the BIST microcode or other means for accessing the cache. As described below, the MACMOD bit is set to 0 to read microcode ROM in response to a microcode ROM access instruction (SYSCTL), BIST microcode, or other means employed to invoke a ROM access. The CDEBUG and MACMOD bits may be stored in any microcode-accessible register.

After pushing the stack, the microcode then executes a microcode return, which pops the dummy address and the two state bits off the microaddress stack 300 into the state register latch 304. This action causes the dummy address to be presented to the IFU 108. The address path demultiplexer 220, under control of the MACMOD bit, directs the dummy address to the cache, and to the hit logic 206, in particular.

Figure 8:
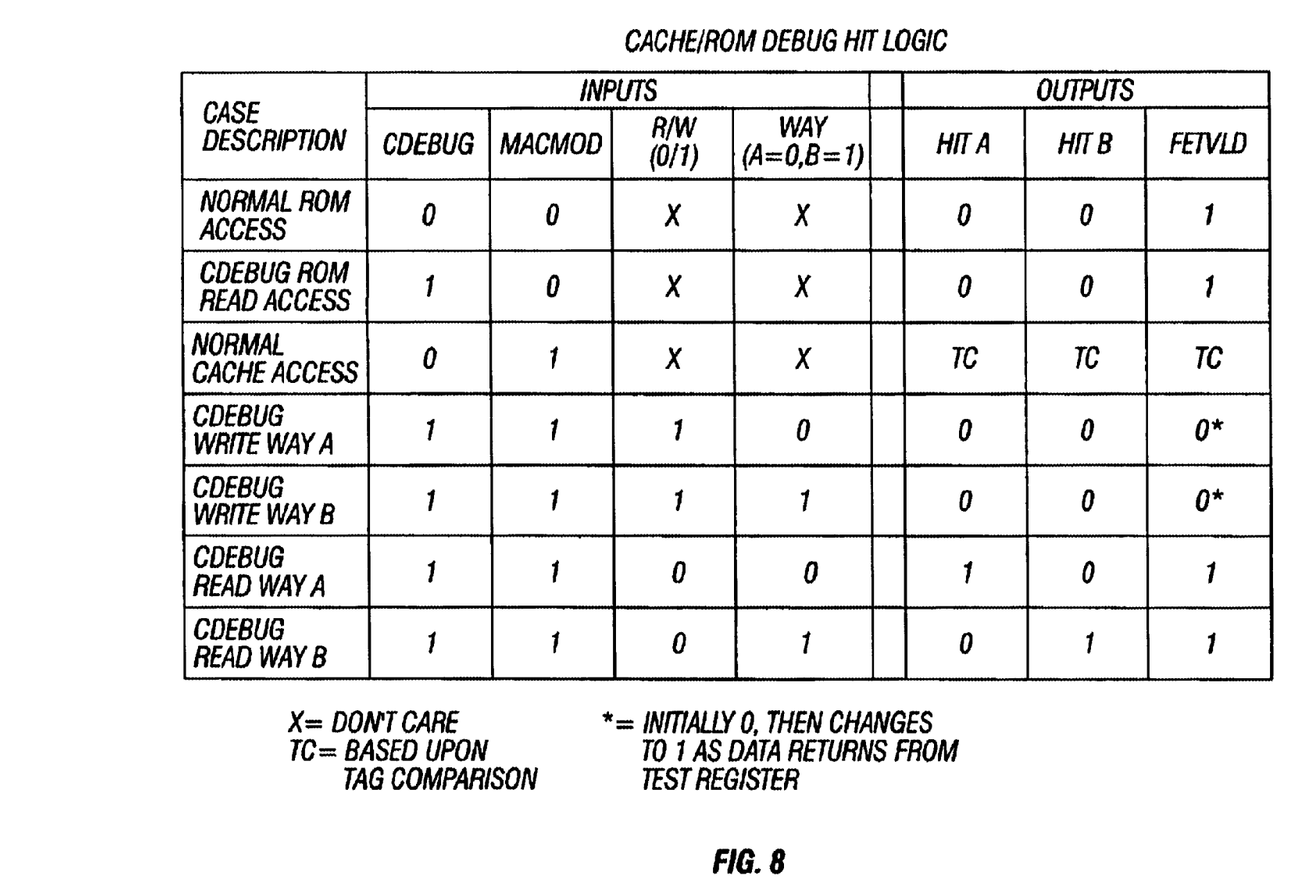
FIG. 8 is a truth table for debug hit logic of the present invention.

The hit logic 206 incorporates conventional tag comparison logic to detect a hit or a miss, along with additional control logic of the present invention. Based upon the following description, those skilled in the art could implement the hit logic using well-known logic techniques. To this end, a logic table for the hit logic 206 is illustrated in FIG. 8.

Figure 9:
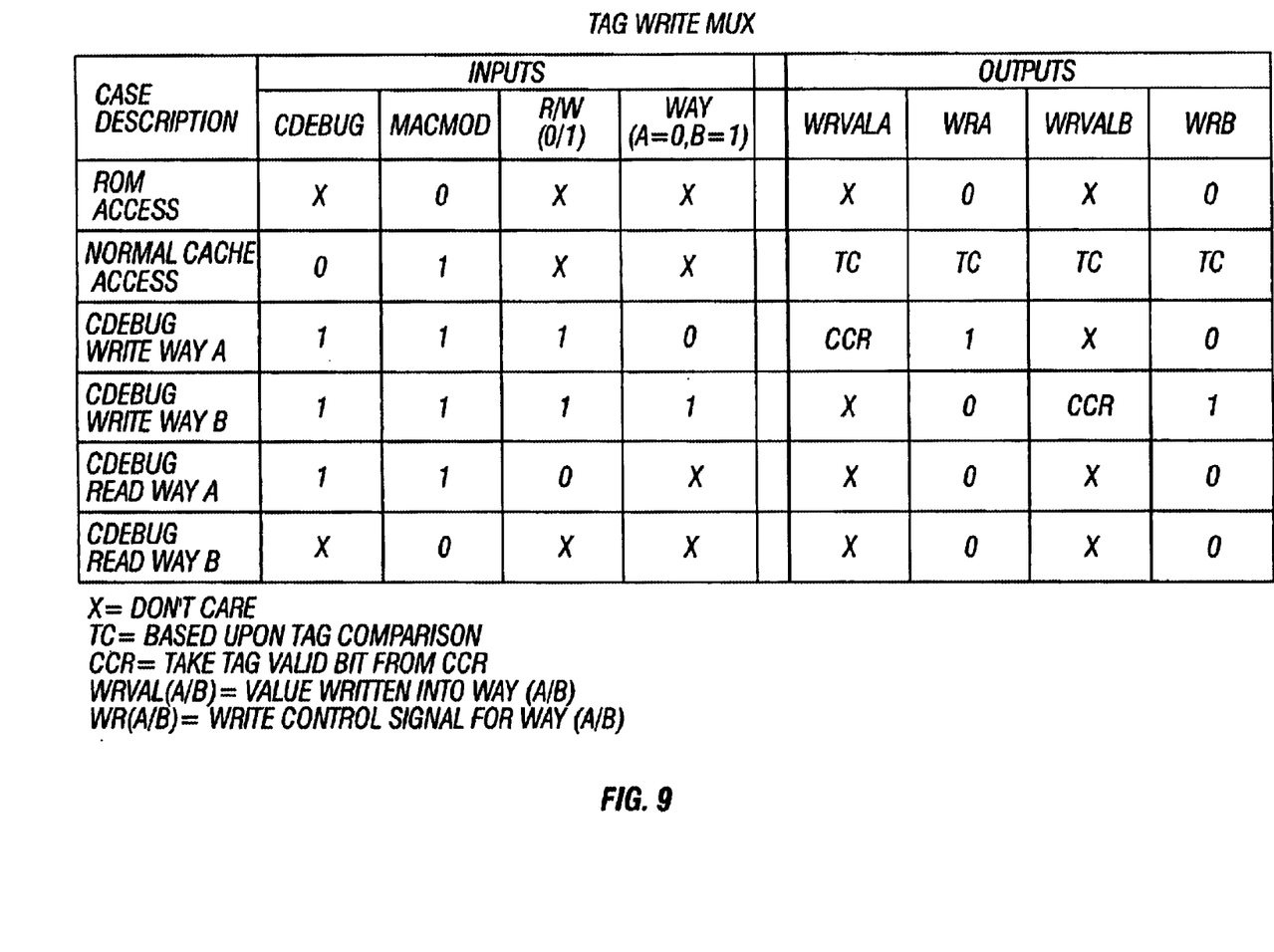
FIG. 9 is a truth table for a tag write multiplexer of the present invention.

During a normal instruction fetch, the tags stored in the tag array 202 would be compared with the address received from the core 116. In response to the tag comparison, the resulting hit or miss would be represented by a two-bit HIT A/B signal, which indicates whether a hit or a miss occurs on a Way A or Way B. However, the hit logic 206 of the present invention also receives the CDEBUG bit as an input. Referring to FIG. 8, during a write operation (R/W=1), the CDEBUG bit being set to 1 forces the hit logic to indicate a miss preferably by clearing the two-bit HIT A/B signal to indicate misses for both ways of the cache. The miss is also indicated by setting a fetch valid (FETVLD) signal to 0, as shown in FIG. 8. In response to the miss, the LRU bit, the tag valid bit and the tag portion of the dummy address are written into the tag array 202. One skilled in the art will recognize that, except for forcing the LRU and tag valid bits, a conventional instruction fetch mechanism would perform the same functions in response to a miss. The present invention writes the tag valid and LRU bits from the CCR 212 to the tag array 202 through a tag write multiplexer (MUX) 222 under control of the CDEBUG bit, the way bit, the MACMOD bit and the R/W bit. A logic table for the tag write multiplexer is illustrated in FIG. 9. The signals WRVALA and WRVALB are MUX 222 outputs representing the values (tag valid or LRU) to be written into Way A and Way B of the tag array, respectively. The signals WRA and WRB are MUX 222 outputs representing control signals instructing the tag array to write the values into either Way A or Way B, respectively. For example, the multiplexer 222 passes the tag valid bit to Way B of the tag array if CDEBUG=1, way bit=Way B, MACMOD=1 and R/W indicates a write.

The FETVLD signal is also fed into the fetch logic 210. In response to FETVLD having a zero value, conventional fetch logic would send a fetch request to the bus controller to fetch the addressed instruction from the external memory 102. According to the present invention, however, the dummy address may not correspond to an instruction address in external memory. The purpose of a dummy address is only to "trick" the tag array into storing the tag valid bit and the tag field of the dummy address. Accordingly, the fetch logic and the bus controller have been modified according to the present invention so that the fetch logic 210 passes the CDEBUG bit to the bus controller 115. In response to receiving the CDEBUG bit (CDEBUG=1), the bus controller logic 218 causes the instruction to be provided to the instruction cache array 204 from TESTREG1 216, rather than from the external memory 102. The bus controller logic 218 also causes the word valid bit stored in TESTREG2 216 to be written into the word valid bit of the cache array 204 that corresponds to the entry receiving the instruction from TESTREG1. In normal mode, the word valid bit would be driven to a 1, corresponding to a valid instruction. In CDEBUG mode, by driving this bit with the TESTREG2 value, this mechanism allows a 0 or a 1 to be written in order to identify data dependency problems in the cache. Those skilled in the art will understand that the bus controller logic 218 multiplexes the values from the test registers into the cache array 204 when CDEBUG=1.

After the above-described dummy instruction fetch has been performed, Way A of the tag array row corresponding to the starting set number holds the tag value and the tag valid bit that were provided by the user through the ICCTL instruction, the BIST routine, or any other means used to invoke the CDEBUG access. Moreover, the cache array 204 stores the first instruction, INST 0, and the corresponding word valid bit in the first word field and the first word valid bit field, respectively, of Way A at the cache line address pointed to by the starting set number. Employing the conventional instruction fetch mechanism, the present invention passes the fetched instruction word through the data path MUX 208 to the core 116. However, because the CDEBUG bit is set to indicate a dummy access, the instruction sequencer 114 suppresses execution of the fetched dummy instruction.

When the bus controller logic 218 causes data to be returned from the test registers to the cache, it also issues a return signal to indicate completion of the dummy fetch. This signal causes the hit logic 206 to reset the FETVLD to 1 so that a miss is no longer indicated. The return signal also causes the instruction sequencer 114 to perform an implicit pop on the microaddress stack 300 to pop the return address D into the state register 304. The return address D is sent to the IFU 108 to retrieve the next microcode instruction from microcode ROM 214 to continue executing the process of FIG. 4. The microcode then determines whether all instruction words have been written within the way (here Way A) (step 412). If not, the word address is incremented to point to the next word in the way (step 414). The test registers are loaded with the next instruction word and word valid bit (step 406). The new word address is used to form a new dummy address (step 408). The dummy instruction fetch is again invoked by the microcode, which, during this iteration, causes the next dummy instruction, INST 1, from TESTREG1, and the next word valid bit from TESTREG2, to be written into the cache array 204 at the second word within Way A. This process continues until the fourth instruction INST 3 is loaded into the fourth word of Way A. At this point, the microcode determines that all words have been written in Way A (step 412). Because Way B has not been written yet (step 416), the microcode sets the way bit to indicate Way B (step 418) and resets the word address to point to the first word in Way B (step 420). The new way bit is loaded into the CCR (step 404). Also, the test registers are loaded with the first instruction word and word valid bit for Way B (step 406). The microcode then forms a new dummy address (step 408) and causes a dummy instruction fetch (step 410). After all of the words in Way B have been written (steps 412 and 416), the microcode increments the set number (step 422), and the process continues until all words in all ways of the ending set have been written.

Cache Read Operation

After writing the cache, a read access may be performed to verify the cache. The read access may be executed after performing a CDEBUG write access, or after normal cache operations. The read access essentially follows the same process steps as the write access of FIG. 4. The read access differs, however, in that the R/W bit of the CCR 212 is cleared to indicate a read operation, and the test registers 216 are not loaded with any data, i.e., step 406 is omitted. Further, the data path bit in the CCR 212 is set to indicate whether (i) the instruction words from the cache array 204 are to be read, or (ii) the LRU bit, the tag and the tag valid bit from the tag array 202 and the word valid bit from the cache array 204 are to be read. The selected information is passed through the data path MUX 208 to the processor core 116 under control of the data path control bit.

Referring to FIG. 4, as with the write operation, if the starting set number is equal to the ending set number (step 400), then execution will be terminated (step 401). If, however, the read operation is not complete, then the microcode sets the read operation to begin at Way A (step 402). After setting the way bit, the CCR 212 is loaded with the R/W bit to indicate a read operation (step 404). The R/W bit may alternatively be cleared before setting the way bit. The LRU and the tag valid bits in the CCR are ignored. As mentioned above, the test registers are not loaded for a read operation.

The dummy address is then created and the dummy instruction fetch performed as described above with respect to the write operation (steps 408, 410). However, unlike the write operation, in response to the R/W bit being set to indicate a read access, the hit logic 206 preferably sets the HIT A/B signal to indicate a hit on the way specified by the value of way bit. This action causes the data path MUX 208 to pass data from the specified way, and forces the cache to act as if there were a cache hit on the specified way regardless the state of the tag valid bits and the word valid bits. For example, if a CDEBUG write operation were performed before the read, then during the write, the tag valid bits and the word valid bits for a particular word may, for example, have been set to 0 to indicate an invalid state. Regardless, the hit logic 206 would force a hit for the addressed word by indicating a hit (HIT A/B=(Way A, Way B)) on the way specified by the way bit. The dummy instructions are not necessarily correlated with external memory locations specified by the dummy addresses. Thus, under a normal instruction fetch, a cache miss would almost surely occur. However, by forcing a hit on a read operation, the hit logic 206 of the present invention suppresses an external memory access and instead causes a cache read to occur.

During a normal instruction fetch, the LRU bit would be updated to ensure that the cache entry storing the fetched instruction was not designated as the least recently used entry. However, because the present invention uses the dummy instruction fetch, the microcode suppresses the normal updating of the LRU bit.

After each dummy instruction fetch during a read operation, the instruction is passed through the data path MUX 208 to the processor core 116. In response to the CDEBUG bit indicating a dummy access, the instruction sequence 114 suppresses execution of the dummy instruction. The microcode may instead cause the instruction (or the valid bits, tag and LRU) being read to be stored in a register and compared to the actual value of the data that was written during the write operation. In this manner, the cache may be verified. One skilled in the art will recognize that the returned data may be used for other purposes.

The microcode then determines whether all instruction words have been read from the way (here Way A) (step 412). If not, the word address is incremented to point to the next word in the way (step 414). This address is used to form a new dummy address (step 408) (step 406 is omitted). The dummy instruction fetch is again invoked, which, during this iteration, causes the next dummy instruction to be read from the second word within Way A. This process continues until the fourth instruction INST 3 is read from the fourth word of Way A. At this point, the microcode determines that all words have been read from Way A (step 412). Because Way B has not been read (step 416), the microcode sets the way bit to indicate Way B (step 418) and resets the word address to point to the first word in Way B (step 420). The CCR is loaded with the new way bit (step 404). A new dummy address is formed (step 408) and a dummy instruction fetch is performed (step 410). After all of the words in Way B have been read (steps 412 and 416), the set number is incremented (step 422), and the process continues until all words in all ways of the ending set have been read.

Figure 7:
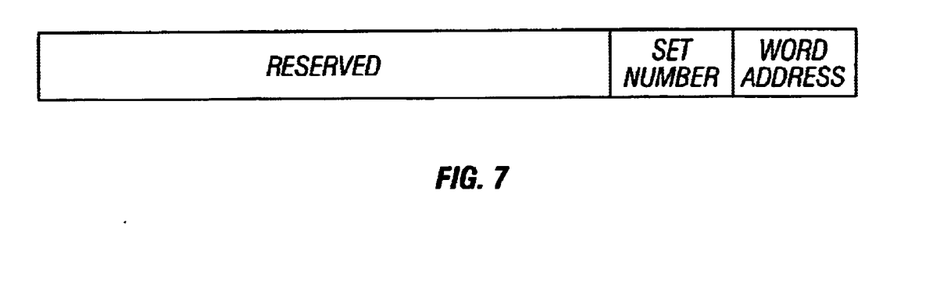
FIG. 7 illustrates a second cache control register of the present invention.

The present invention not only permits the instruction cache to be accessed on a set basis, but also on a word basis. According to the set-by-set access of FIG. 4, the microcode increments the set number beginning at the starting set number provided by BIST registers or the ICCTL instruction. Further, the microcode cycles through all the words within a way, generating the word address during each iteration of the access. Alternatively, to access a particular word in the instruction cache, the user or the BIST routine may provide the set number and the word address using a second cache control register that includes those values, as shown in FIG. 7. These values would be concatenated with the dummy tag to form the dummy address. For an ICCTL access, the set number and word address may be passed as arguments of the instruction itself or read from the external data structure.

One skilled in the art will recognize that the present invention is not limited to the above-described techniques used to supply the parameters necessary for full cache accessibility, but may easily be extended to other means as well.

Microcode ROM Access

The present invention also permits the reading of data from the microcode ROM 214. In one embodiment, the ROM read is performed through execution of an instruction of the form:

SYSCTL (start-addr, end-addr)

As with ICCTL, this instruction may be entered externally by the user or executed internally by the BIST routine, among other methods. The arguments start-addr and end-addr are the starting and ending addresses of data in the microcode ROM to be read. As with ICCTL, the microcode for the microcode ROM access includes the following microcode sequence:

PUSH RETURN ADDRESS D
PUSH DUMMY ADDRESS, CDEBUG, MACMOD
MICROCODE RETURN
D: CONTINUE

In this case, however, the dummy address is not formed by the concatenation of the tag, the set number and the word address, but rather is provided more directly as an address within the range start-addr to end-addr as arguments of the SYSCTL instruction if externally executed, or stored in a register or in the microcode ROM itself during execution of BIST or other programming logic (e.g., event handler) that may invoke the ROM access. As before, the CDEBUG bit is set to indicate a dummy access. However, in this case the MACMOD bit is cleared to indicate a ROM access. After the return address, the dummy address and the state bits have been pushed onto the microaddress stack 300 of the instruction sequencer 114, the microcode return instruction is executed to pop the dummy address and state bits off the stack.

Through the address path demultiplexer (MUX) 220, the MACMOD bit causes the dummy address to be presented to the microcode ROM 214 instead of the cache. Presentation of the address to the microcode ROM 214 causes the addressed instruction to be read out of the ROM and presented to the data path MUX 208. The MACMOD bit causes the data path MUX 208 to pass the ROM instruction on to the core 116. As with a cache access, the CDEBUG bit causes the instruction sequencer 114 to suppress execution of the retrieved microcode instruction, and instead passes the instruction to a register. The process repeats for each ROM word starting at start-addr until end-addr is reached.

As with the cache accesses, the ROM access need not be performed by the SYSCTL instruction, but may be performed by any hardware or software programming logic that achieves the same functionality.

The retrieved instructions may then be used to verify the microinstructions that were burned into the ROM. Preferably, verification may be achieved by comparing a checksum of either a subset of or all of the ROM instructions to a known checksum of the ROM instructions.

It can thus be appreciated that the present invention provides full accessibility to both cache and microcode ROM by taking maximum advantage of the preexisting on-chip instruction fetch mechanism of conventional processors.

It will be appreciated that various modifications and alterations might be made by those skilled in the art without departing from the spirit and scope of the present invention. In particular, one skilled in the art will recognize that all registers described herein may be implemented using a wide variety of electronic storage circuits. The invention should, therefore, be measured in terms of the claims which follow.

What is claimed is:

1. A method for reading data from a microcode ROM in a microprocessor, the method comprising:

invoking from a processor core an instruction fetch to retrieve data from a predetermined address in the microcode ROM, wherein invoking the instruction fetch includes pushing the predetermined address and a first state bit onto a procedure return stack, the first state bit representing the signal indicating the test mode and executing a procedure return instruction; and suppressing execution of the data retrieved from the predetermined address in the microcode ROM in response to a signal indicating a test mode, regardless of whether the data retrieved comprises a branch or non-branch instruction: and passing the data retrieved from the predetermined address in the microcode ROM to a storage unit.

2. The method of claim 1, wherein invoking the instruction fetch comprises, pushing a return address onto a procedure return stack.

3. The method of claim 2 further comprising popping the return address off the procedure return stack to continue instruction fetching.

4. The method of claim 1, wherein the microcode ROM for storing programming logic is implemented through execution of the programming logic.

5. The method of claim 4, wherein execution of the programming logic is invoked by a BIST routine.

6. The method of claim 4, wherein execution of the programming logic is invoked by a user-input instruction.

7. The method of claim 4, wherein execution of the programming logic is invoked by an event handler.

8. An apparatus for reading data from a microcode ROM in a microprocessor, the apparatus comprising:

first programming logic of a processor core for invoking an instruction fetch to retrieve data from a predetermined address in the microcode ROM, including pushing the predetermined address and a first state bit onto a procedure return stack, the first state bit representing the signal indicating the test mode and executing a procedure return instruction to invoke the instruction fetch; and wherein the microprocessor suppresses execution of the data retrieved from the predetermined address in the microcode ROM in response to a signal indicating a test mode, regardless of whether the data retrieved comprises a branch or non-branch instruction, and passing the data retrieved from the predetermined address in the microcode ROM to a storage unit.

9. The apparatus of claim 8 further comprising second programming logic for pushing a return address onto a procedure return stack.

10. The apparatus of claim 9, wherein the first programming logic and the second programming logic are invoked by a BIST routine.

11. The apparatus of claim 9, wherein the first programming logic and the second programming logic are invoked by a user-input instruction.

12. The apparatus of claim 9, wherein the first programming logic and the second programming logic are invoked by an event handler.

13. The apparatus of claim 8, wherein the first programming logic is invoked by a BIST routine.

14. The apparatus of claim 8, wherein the first programming logic is invoked by a user-input instruction.

15. The apparatus of claim 8, wherein the execution of the first programming logic is invoked by an event handler.

* * * * *